US009112566B2

(12) United States Patent  (10) Patent No.: US 9,112,566 B2
Nentwig  (45) Date of Patent:  Aug. 18, 2015

(54) FILTER

(71) Applicant: Broadcom Corporation, Irvine, CA (US)

(72) Inventor: Markus Rudiger Nentwig, Helsinki (FI)

(73) Assignee: BROADCOM CORPORATION, Irvine, CA (US)

( * ) Notice: Subject to any disclaimer, the term of this patent is extended or adjusted under 35 U.S.C. 154(b) by 353 days.

(21) Appl. No.: 13/777,601

(22) Filed: Feb. 26, 2013

(65) Prior Publication Data

US 2013/0235959 A1  Sep. 12, 2013

(30) Foreign Application Priority Data

Mar. 9, 2012 (GB) .................................. 1204234.7

(51) Int. Cl.
H04B 1/10 (2006.01)
H03H 19/00 (2006.01)

(52) U.S. Cl.
CPC .............. H04B 1/10 (2013.01); H03H 19/002 (2013.01)

(58) Field of Classification Search
CPC ........ H04B 1/123; H04B 7/002; H04B 1/109; H04B 1/30; H04B 1/1027; H04B 1/18; H04B 1/1036; H04B 1/10; H04B 10/29; H04B 13/00; H04B 1/0057; H04B 1/0475; H04B 1/525; H04L 1/06; H04L 25/0204; H04L 7/027; H04L 25/00; H04L 27/2071; H04L 27/2275; H03H 11/1291; H03H 7/0115; H03H 19/002; G01R 27/16; G01R 31/3662; H02M 1/126; H04M 1/585; H04M 1/76
See application file for complete search history.

(56) References Cited

U.S. PATENT DOCUMENTS

| 2,981,892 | A | | 4/1961 | Franks et al. |
| 5,937,341 | A | * | 8/1999 | Suominen ..................... 455/324 |
| 6,011,431 | A | * | 1/2000 | Gilbert .......................... 330/305 |
| 8,644,786 | B2 | * | 2/2014 | Mirzaei et al. ................ 455/318 |
| 2004/0180642 | A1 | * | 9/2004 | Elmala et al. ................. 455/306 |
| 2008/0095284 | A1 | * | 4/2008 | Hori et al. ..................... 375/350 |
| 2008/0218273 | A1 | * | 9/2008 | Uehara et al. ................. 330/306 |
| 2011/0003572 | A1 | | 1/2011 | Mirzaei et al. |
| 2012/0039401 | A1 | * | 2/2012 | D'Souza et al. ............. 375/259 |
| 2013/0149983 | A1 | * | 6/2013 | Fahim et al. .................. 455/326 |

FOREIGN PATENT DOCUMENTS

GB  1 228 511 A  4/1971
WO  WO 2005/074122 A1  8/2005

OTHER PUBLICATIONS

UKIPO Combined Search and Examination Report under Section 17 and 18(3) dated Jun. 29, 2012 which is issued in a related British Application No. GB1204234.7 (5 page).

* cited by examiner

Primary Examiner — Lana N Le
(74) Attorney, Agent, or Firm — Foley & Lardner LLP

(57) ABSTRACT

An apparatus and method suppress unwanted signal components in receiving signals during wireless communication. A first circuitry is arranged to process a first signal, a second circuitry is arranged to apply transferred impedance filtering on a second signal according to a filter clock frequency, a signal branching circuitry is arranged to branch an input signal into the first circuitry and the second circuitry, and a signal combining circuitry is arranged to combine the processed first signal and the filtered second signal such that signal components of the first signal processed in the first circuitry and the filtered second signal are in-phase for signal frequencies equal to the filter clock frequency.

17 Claims, 4 Drawing Sheets

FILTER

CROSS REFERENCE TO RELATED APPLICATION

This application claims benefit under 35 U.S.C. §119(a) and 37 CFR 1.55 to UK Patent Application No. 1204234.7, filed on 9 Mar. 2012, the entire content of which is hereby incorporated by reference.

TECHNICAL FIELD

The present disclosure relates generally to an apparatus and method for suppressing unwanted signal components in receiving signals in wireless communication, and in particular, but not exclusively, to analog baseband parts for use in mobile devices for wireless communication such as according to LTE, triple-carrier WCDMA and the like.

BACKGROUND INFORMATION

Prior art which is related to this technical field can e.g. be found in specifications describing analog baseband filters.
The following meanings for the abbreviations used in this specification apply:
HSDPA: High Speed Downlink Packet Access
LTE: Long Term Evolution
LTE-A: LTE-Advanced
TI: Transferred Impedance
TIF: Transferred Impedance Filter
TIS: Transferred Impedance Structure
WCDMA: Wideband Code Division Multiple Access The analog baseband filter in a receiver is required to suppress unwanted signal components before analog-to-digital conversion.

For example, in a transceiver, a transmit signal is generated at a sufficiently high power level for transmission. Thus, a part of the transmit signal can leak into a receive path due to an unwanted coupling mechanism, resulting, in an unwanted signal component known as "transmit leakage". The unwanted coupling mechanism may be caused by finite attenuation of a duplex filter or parasitic coupling between lines on a printed wiring board, for example. The transmit leakage is processed by the receive path, and appears at the input of an analog-to-digital converter at a frequency offset relative to the wanted signal component. Depending on the frequency offset and the analog-to-digital converter conversion rate, the transmit leakage may result in an alias component being created by the analog-to-digital converter.

SUMMARY

An apparatus and method for suppressing unwanted signal components in receiving signals in wireless communication are provided.

According to first aspect embodiments, there is provided apparatus for use in a communication device, the apparatus including a first circuitry arranged to process a first signal, a second circuitry arranged to apply transferred impedance filtering, on a second signal according to a filter clock frequency, a signal branching circuitry arranged to branch an input signal into the first circuitry and the second circuitry, and a signal combining circuitry arranged to combine the processed first signal and the filtered second signal such that signal components of the first signal processed in the first circuitry and the filtered second signal are in-phase for signal frequencies equal to the filter clock frequency.

In embodiments, the apparatus is arranged for use in a wireless communication device.

According to second embodiments, there is provided a method for use in a communication device, the method including branching an input signal into a first signal and a second signal, processing the first signal in a first circuitry, transferred impedance filtering the second signal in a second circuitry according to a filter clock frequency, and combining the processed first signal and the filtered second signal such that signal components of the processed first signal and the filtered second signal are in-phase for signal frequencies equal to the filter clock frequency.

In embodiments, the method is for use in a wireless communication device.

Accordingly, it is possible to provide a technique to equalize the gain of a wanted signal bandwidth.

DETAILED DESCRIPTION

In the following, description is made of embodiments of the present disclosure. It is to be understood, however, that the description is given by way of example only, and that the described embodiments are by no means to be understood as limiting, the present disclosure thereto.

For example, for illustration purposes, in some of the following embodiments, suppressing unwanted signal components in receiving signals in wireless communication in cellular communication networks as e.g. based on LIE, LTE-Advanced or WCDMA is described. However, it should be appreciated that these embodiments are not limited for use among these particular types of wireless communication systems, and further embodiments can be applied also to other types of communication systems and access networks in which suppressing unwanted signal components in receiving signals in wireless communication is to be implemented and optimized. For example, other applications include use in base stations or machine-to-machine communications such as vending machines or cash registers.

Thus, embodiments relate to mobile wireless communication systems, such as LTE, LTE-Advanced and WCDMA. In more detail, embodiments are related to the configuration of an LTE/WCDMA radio receiver and components thereof such as mobile device receiver integrated circuits and/or discrete elements.

However as indicated above, embodiments are not limited thereto, but other embodiments are related to general radio receiver equipment.

Figure 1:
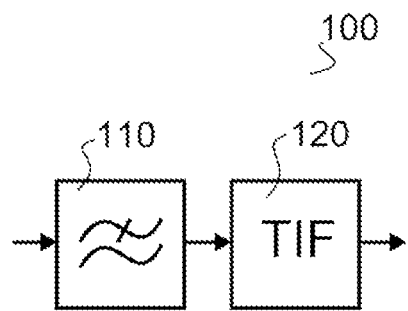
FIG. 1 shows a combination of a continuous time baseband filter and a transferred impedance filter according to embodiments.

FIG. 1 shows an implementation example of an analog baseband filter according to embodiments including a combination of a continuous time baseband filter 110 and a transferred impedance filter 120. The received signal may thus pass through the continuous time filter 110 and the transferred impedance filter 120 to which a clock signal is applied. It is to be noted that the arrangement order of continuous time filter 110 and transferred impedance filter 120 may be reversed.

Figure 2:
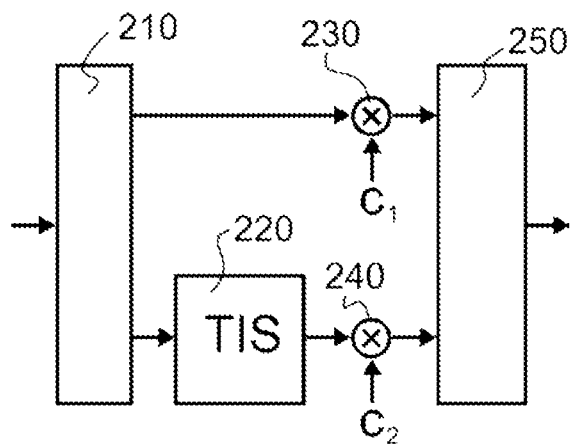
FIG. 2 shows the transferred impedance filter of FIG. 1 according to embodiments.

An implementation example according to embodiments liar the transferred impedance filter shown in FIG. 1 is shown in FIG. 2.

Specifically, as shown in FIG. 2, the implementation example includes an apparatus for use in a wireless communication device, including a first circuitry arranged to process a first signal, a second circuitry 220 arranged to apply transferred impedance filtering on a second signal according to a filter clock frequency, a signal branching circuitry 210 arranged to branch an input signal into the first circuitry and the second circuitry 220, and a signal combining circuitry 250 arranged to combine the processed first signal and the filtered second signal such that signal components of the first signal processed in the first circuitry and the filtered second signal are in-phase for signal frequencies equal to the filter clock frequency.

Another implementation example according to embodiments includes an apparatus for use in a wireless communication device, including first circuitry means for processing a first signal, second circuitry means 220 for applying transferred impedance filtering on a second signal according to a filter clock frequency, signal branching means 210 for branching an input signal into the first circuitry means and the second circuitry means 220, and signal combining means 250 for combining the processed first signal and the filtered second signal such that signal components of the first signal processed in the first circuitry means and the filtered second signal are in-phase for signal frequencies equal to the filter clock frequency.

Still another implementation example according to embodiments includes an apparatus, including a first circuitry configured to process a first signal, a second circuitry 220 configured to apply transferred impedance filtering on a second signal according to a filter clock frequency, a signal branching circuitry 210 configured to branch an input signal into the first circuitry and the second circuitry 220, and a signal combining circuitry 250 configured to combine the processed first signal and the filtered second signal such that signal components of the first signal processed in the first circuitry and the filtered second signal are in-phase for signal frequencies equal to the filter clock frequency.

According to embodiments, the above described implementation examples can be modified as follows, wherein one or more of the modifications, unless stated as excluding alternatives, can be freely combined.

Embodiments further include at least one continuous time filter stage connected to either one of the signal branching circuitry and the signal combining circuitry, wherein the filter clock frequency approximately matches a frequency passband edge of the at least one continuous time filter stage.

The first circuitry can include a first scaling processor arranged and/or configured to apply a first scaling factor, and the second circuitry can include a second scaling processor arranged and/or configured to apply a second scaling factor.

The second circuitry can be arranged and/or configured to apply the transferred impedance filtering on the second signal according to the filter clock frequency by consecutively connecting a plurality of capacitors in a forward direction and consecutively connecting the plurality of capacitors in a reverse direction in accordance with the filter clock frequency.

The signal combining circuitry can include a first voltage current converter circuitry in operable connection with the first circuitry branch and arranged and/or configured to output a first current, a second voltage current converter circuitry in operable connection with the second circuitry branch and arranged and/or configured to output a second current, and an adding circuitry arranged and/or configured to add the first current and the second current to a sum current and to output the sum current.

The first voltage current converter circuitry and the second voltage current converter circuitry are arranged and/or configured to realize application of scaling factors to the first current and the second current, respectively.

The first circuitry, the second circuitry, the signal branching circuitry, and the signal combining circuitry can be arranged and/or configured for use in a wireless communication system according to the Long Term Evolution and/or the Wideband Code Division Multiple Access specifications.

In embodiments, any of the above described apparatuses is arranged and/or configured for use in a mobile (or 'cellular') phone and further includes user interface circuitry, and user interface software arranged to enable user control through use of a human-machine-interface such as a display.

In embodiments, any of the above described apparatuses is arranged and/or configured for use in a wireless communication device and further includes wired interface circuitry, and wireless transceiver circuitry.

A still further implementation example of the apparatus according to embodiments includes that a mobile phone includes any of the above apparatuses.

Figure 3:
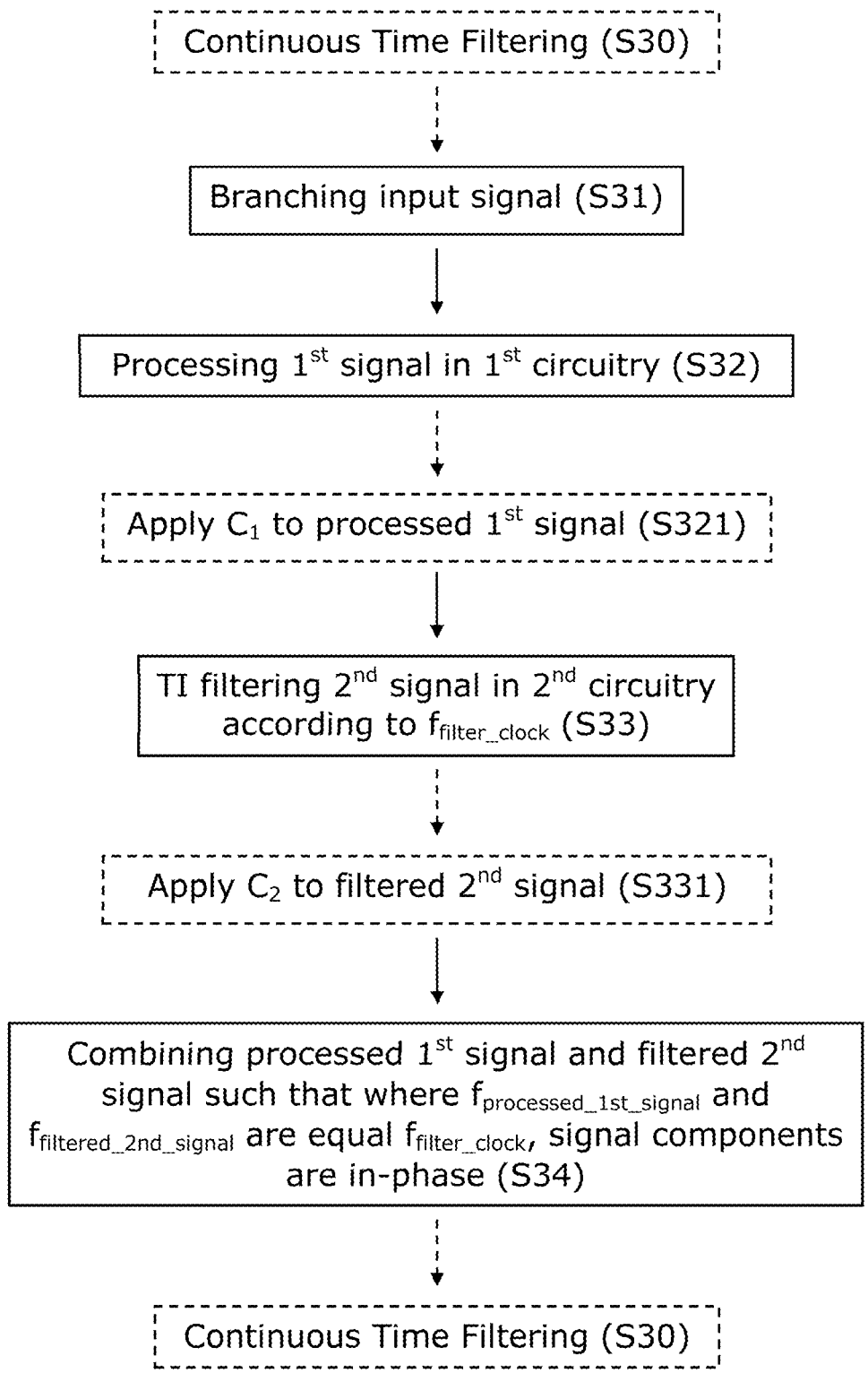
FIG. 3 is a flow chart of a method according to embodiments.

FIG. 3 shows a principle flowchart of an example for a method according to embodiments. That is, as shown in FIG. 3, this method includes branching (S31) an input signal into a first signal and a second signal, processing (S32) the first signal in a first circuitry, transferred impedance filtering (S33) the second signal in a second circuitry according to a filter clock frequency, and combining (S34) the processed first signal and the filtered second signal such that signal components of the processed first signal and the filtered second signal are in-phase for signal frequencies equal to the filter clock frequency.

According to embodiments, the above described example method can be modified as follows, wherein one or more of the modifications can be freely combined unless explicitly stated as excluding alternatives.

The method can farther include continuous time filtering (S30) either the input signal prior to branching the input signal or an output signal corresponding to the combination of the processed first signal and filtered second signal, wherein the filter dock frequency approximately matches a frequency passband edge of the continuous time filter.

The method can further include applying (S321) a first scaling factor to the processed first signal, and applying (S331) a second scaling factor to the filtered second signal.

The transferred impedance filtering (S33) of the second signal in a second circuitry according to a filter clock frequency can include consecutively connecting a plurality of capacitors in a forward direction and consecutively connecting the plurality of capacitors in a reverse direction in accordance with the filter clock frequency.

The combining (S34) of the processed first signal and the filtered second signal can include voltage current conversion of the processed first signal and outputting a first current, voltage current conversion of the filtered second signal and outputting a second current, and adding the first current and the second current to a sum current and outputting the sum current.

The voltage current conversion of the processed first signal and the filtered second signal can respectively include applying scaling factors to the first current and the second current.

One option for performing the example of a method according to embodiments is to use the apparatus described in connection with FIG. 2 or a modification thereof which becomes apparent from the embodiments as described herein below.

Embodiments are described herein below in further detail. Reference is made to implementation examples which depict embodiments. It is to be noted though, that the implementation examples are provided for illustrative purposes only and are not intended to be understood as limiting embodiments thereto. Rather, it is to be understood that the features of the implementation examples may be interchanged and mixed as will be understood from the whole of the present specification.

As described in the introductory part, an analog baseband filter in a receiver is required to suppress unwanted signal components before analog-to-digital conversion. However, particularly if power-efficient analog-to-digital converters with low sampling rate are used, alias component are produced in a frequency band where the transmitted signal leaks to the receiver. Suppression of the transmitted signal requires a high-performance analog baseband filter, i.e. with sufficient rejection at the transmit frequency.

Conventionally, an analog baseband filter is constructed of multiple "continuous-time" filtering stages, based on operational amplifier stages and passive components. Filtering performance relates to the number of filtering stages and their parameters. In general, using fewer filter stages results in using less chip area and lower power consumption. The performance also relates to limitations on the quality ("Q") factor of used filtering stages. Use of high Q factors enables better filtering, but makes implementation difficult, i.e. requires on-chip calibration and increases power consumption. Further, it is difficult to design filters with sufficient rejection that achieve low passband ripple at the same time. That is, one inherent limitation in continuous time filters is that resonance peaks are used to compensate for a drop in frequency response of another stage. The height and width of a resonance peak is linked via the Q factor and cannot be chosen independently. Further, only low Q factors can be implemented due to implementation constraints. Thus, it is desirable for filters that meet passband and/or stopband attenuation requirements with fewer continuous time stages to save current and area.

Besides "continuous-time" filtering stages, so-called "transferred impedance" filtering stages can be used to suppress an unwanted signal at a specific frequency. A transferred impedance filter uses a resistor-capacitor (RC) lowpass filter and translates it using a mixer driven with a clock signal to a carrier frequency.

According to embodiments, a received (wanted) signal is filtered with a continuous-time filter, and a transferred impedance peaking filter is applied to equalize a frequency response of the continuous-time filter, wherein the transferred-impedance peaking filter includes transferred-impedance filtering on a signal, and adding the transferred-impedance-filtered signal to the original signal so that signal components are in-phase for signal frequencies equal to the clock frequency of the transferred-impedance.

As explained above, this is illustrated in FIG. 1, showing a block 110 for a continuous time filter and a block 120 for a TIF, wherein the received signal is supplied to the continuous time filter 110 which outputs a signal to the TIF 120 which is clocked at a defined clock frequency depending on the designed passband edge of transmission of the wanted signal. The clock frequency of the TIF 120 is configured to match the frequency passband edge of the continuous time filter stage 110 as close as possible, i.e. the filter clock frequency of the TIF 120 approximately matches the frequency passband edge of the continuous time filter stage. Since the filter clock frequency of the TIF 120 must be derived from some frequency source, for example by (but not limited to) integer division of an available source frequency, there can be some constraints avoiding a perfect match. In the example of producing the filter clock frequency by integer division of a source frequency, "approximately matches" means selecting the integer divisor such that the filter clock frequency of the TIF 120 is as close as possible to the frequency passband edge of the continuous time filter stage 110. That is, for example, in case of a passband edge of 9 MHz, for the clock generation the easily available system clock of 104 MHz can be used, wherein for example 104 MHz/11 provides 9.45 MHz.

According to embodiments, by virtue of using the transferred impedance peaking filter (where "peaking" refers to adding the filtered signal to the substantially unmodified input signal), no frequencies within the wanted band ("in-band") experience excessive gain or attenuation (producing a smooth "ripple" in the gain plot), which would cause unwanted noise boosting and/or require additional headroom to prevent clipping.

Thus, with the bandpass filter being enabled to equalize the passband ripple much more effectively, the continuous time filter (stages) can be adapted to give a higher rejection at a certain rejection target. Accordingly, a bandpass filter can be very efficiently implemented e.g. enabling the use of fewer continuous-time filtering stages for the same requirements, thus conserving chip area and power consumption.

It is to be noted that the order of the blocks can be reversed so that the received signal is supplied to the TIF 120 which then outputs a signal to the continuous time filter 110. It is further to be noted that, as indicated above, although further stages of continuous time filters (e.g. providing a real pole, a conjugate pole pair, etc.) may be added, embodiments including only one such continuous time filter show hilly satisfactory performance.

As explained above, FIG. 2 shows an implementation example for the TIF block 120 of FIG. 1 according to embodiments. Specifically, a signal fed into the TIF is branched in a signal branching circuitry 210 into a first signal branch and a second signal branch. In both signal branches applying a scaling factor ($C_1$, $C_2$) by respective first and second scaling processors 230, 240 can be provided which, according to embodiments, can be provided separately or implemented e.g. in a signal combining circuitry 250 to be described below. As shown in FIG. 2, while the signal of the first signal branch is thus substantially fed through as is, in the second signal branch a transferred impedance structure TIS 220 is provided. The processed signals of both branches are then combined to form a combined signal in a signal combining circuitry 250 which is then output.

Figure 4:
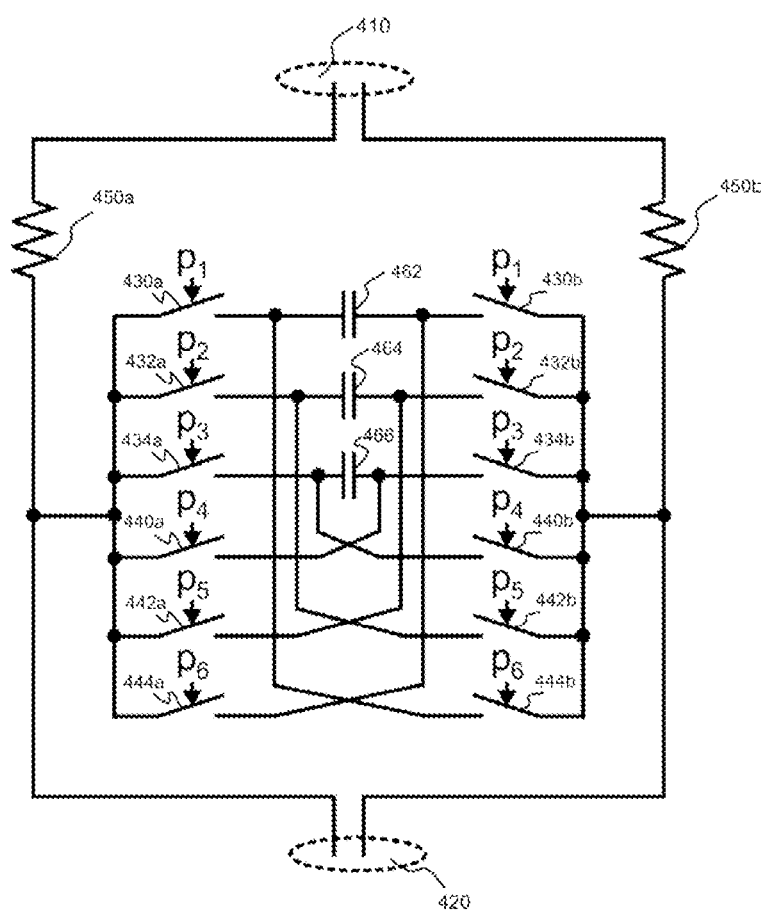
FIG. 4 shows the transferred impedance structure of FIG. 2 according to embodiments.

FIG. 4 shows an implementation example for the TIS block 220 shown in FIG. 2 according to embodiments. Specifically, the node labelled with 410 designates the input of the structure, and the node labelled with 420 designates the output of the structure. Resistors (R) 450a and 450b are connected in series to a capacitance mixing circuitry including (as an example) three capacitors (C) 462, 464, and 466 and switches 430a . . . 444a, 430b . . . 444b, which are operated according to pulses $p_1$ . . . $p_6$. According to embodiments, the switches can be implemented using CMOS transistors.

Note that the structure exemplified in FIG. 4 includes n=6 stages and is arranged for operation with n=6 phases, while the number of capacitors is n/2=3.

Figure 5:
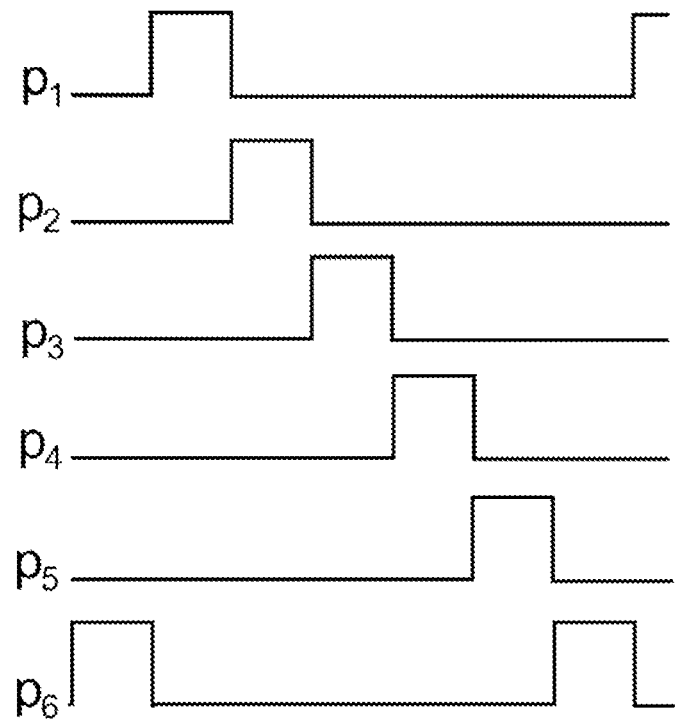
FIG. 5 is an illustration of a sequence of clock pulses for use in the transferred impedance structure of FIG. 4 according to embodiments.

The implementation example of FIG. 4 is driven by the clock signals shown in FIG. 5, illustrating a phase diagram of the clock signal for operating the switches 430a . . . 444a, 430b . . . 444b, i.e. a six-phase clock.

Specifically, only one capacitor is connected at any time, forming an RC voltage divider with the resistors 450a, 450b (differential-mode input signal). The pulses $p_1 \ldots p_6$ corresponding to the respective six phases perform the following connection actions:

p1: 462 connected in forward direction
p2: 464 connected in forward direction
p3: 466 connected in forward direction
p4: 462 connected in reverse direction
p5: 464 connected in reverse direction
p6: 466 connected in reverse direction Thereafter, the cycle is repeated. Conceptually, the structure can be understood such that capacitor 462 "samples" the input signal during phase p1, and "reflects" it back during phase p4. The frequency response is somewhat similar to loading the resistance R (450a, 450b) with a radio frequency "short circuit" delay line of length λ/4 at the cycle frequency. For an input signal at the cycle frequency, the "reflected" signal and the input signal add constructively, and a bandpass response results. A peaking filter is then constructed by adding the output signal of the transferred impedance structure to the filter input signal e.g. in the input of a subsequent signal combining circuitry.

It is understood that embodiments are not limited to a particular number of stages and also in this regard, FIGS. 4 and 5 represent only illustrative implementation examples. That is, the number of stages can be selected according to needs.

The term "clock frequency" relates to one such cycle described above. For example, if the passband edge of the continuous time filter 110 shown in FIG. 1 is 9 MHz, the clock frequency may be 8 MHz, or 10 MHz, which "approximately matches" the passband edge.

Referring again to FIG. 4, a voltage mode signal then appears at the output node 420 and is eventually fed to the signal combining circuitry, where it is added to the signal of the upper branch shown in FIG. 2.

Figure 6:
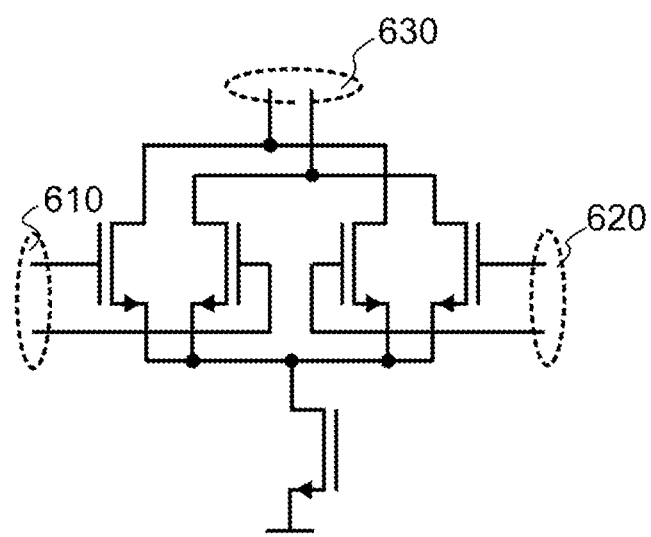
FIG. 6 shows combining circuitry shown in FIG. 2 according to embodiments.

FIG. 6 shows an implementation example for this signal combining circuitry 250 shown in FIG. 2 according to embodiments. Specifically, each transistor pair depicted in FIG. 6 converts the differential voltage of the upper and lower branch of FIG. 2, respectively (e.g. the output of nodes 230 and 240), received at nodes 610 and 620, respectively, into a differential current. The differential currents sum up at node 630 as a current mode output.

As indicated above, the scaling factors $C_1$, $C_2$ shown in FIG. 2 may be implemented by relative scaling of the transistor pairs.

As indicated above, embodiments include radio-frequency cellular chipset(s) and equipment such as according to LTE/LTE-Advanced and/or WDCMA, but are not limited thereto.

According to the above description, it should thus be apparent that embodiments provide, for example from the perspective of a mobile phone, a communication device or a component thereof, an apparatus embodying the same, a method for controlling and/or operating the same, and computer program(s) controlling and/or operating the same as well as mediums carrying such computer program(s) and forming computer program product(s).

For example, described above are apparatuses, methods and computer program products capable of suppressing unwanted signal components in received signals in wireless communication.

Implementations of any of the above described blocks, apparatuses, systems, techniques or methods include, as non-limiting examples, implementations as hardware, software, for example in connection with a digital signal processor, an instruction set, firmware, special purpose circuits or application logic, general purpose hardware or controller or other computing devices, or some combination thereof. Software or application logic or an instruction set may be maintained on any one of various conventionally available computer-readable media (which shall be understood as anything which can contain, store, communicate, propagate or transport instructions in connection with an instruction execution system). Further, it is to be understood that where reference is made to a processor, such processor is to be understood in its broadest sense and may, for example, additionally include or not include a memory (e.g., ROM, CD-ROM, etc.), and it may include a computer processor, an application-specific integrated circuit (ASIC), a field-programmable gate array (FPGA), and/or other hardware components that have been programmed in such a way to carry out the described function.

Further, as used in this application, the term circuitry refers to all of the following: (a) hardware-only circuit implementation (such as implementations in only analog and/or digital circuitry) and (b) to combinations of circuits and software (and/or firmware), such as (as applicable): (i) to a combination of processor(s) (ii) to portions of processor(s)/software (including digital signal processors(s)), software and memory(ies) that work together to cause an apparatus, such as a mobile phone, network device or server, to perform various functions, and (c) to circuits, such as microprocessors(s), that require software or firmware for operation, even if the software or firmware is not physically present.

This definition of circuitry applies to all uses of this term in this application including in any claims. As a further example, as used in this application, the term circuitry would also cover an implementation of merely a processor for multiple processors) or portion of a processor and its for their) accompanying software and/or firmware. The term circuitry would also cover, for example and if applicable to the particular claim element, a baseband integrated circuit or applications processor integrated circuit for a mobile phone or a similar integrated circuit in a server, a cellular network device, or other network and/or communication device.

As will be understood, the or each capacitor in the above embodiments may in practice be provided by one or more capacitors in order to obtain the desired capacitance characteristics.

If desired, the different functions discussed herein may be performed in a different order and/or concurrently with each other. Furthermore, if desired, one or more of the above described functions may be optional or may be combined.

Although various embodiments are set out in the appended independent claims, other embodiments include other combinations of features from the described embodiments and/or the dependent claims with the features of the independent claims, and not solely the combinations explicitly set out in the claims.

The above embodiments are to be understood as illustrative examples. Further embodiments are envisaged. It is to be understood that any feature described in relation to any one embodiment may be used alone, or in combination with other features described, and may 1 also be used in combination with one or more features of any other of the embodiments, or any combination of any other of the embodiments. Furthermore, modifications not described above may also be employed without departing from the scope of embodiments, which is defined in the accompanying claims.

What is claimed is:

1. Apparatus for use in a communication device, the apparatus comprising:
   a first circuitry arranged to process a first signal;
   a second circuitry arranged to apply transferred impedance filtering on a second signal according to a filter clock frequency;
   a signal branching circuitry arranged to branch an input signal into the first circuitry and the second circuitry; and
   a signal combining circuitry arranged to combine the processed first signal and the filtered second signal such that signal components of the first signal processed in the first circuitry and the filtered second signal are in-phase for signal frequencies equal to the filter clock frequency.

2. The apparatus according to claim 1, comprising at least one continuous time filter stage connected to either one of the signal branching circuitry and the signal combining circuitry,
   wherein the filter clock frequency approximately matches a frequency passband edge of the at least one continuous time filter stage.

3. The apparatus according to claim 1, wherein:
   the first circuitry comprises a first scaling processor arranged to apply a first scaling factor, and
   the second circuitry comprises a second scaling processor arranged to apply a second scaling factor.

4. The apparatus according to claim 1, wherein the second circuitry is arranged to apply the transferred impedance filtering on the second signal according to the filter clock frequency by consecutively connecting a plurality of capacitors in a forward direction and consecutively connecting the plurality of capacitors in a reverse direction in accordance with the filter clock frequency.

5. The apparatus according to claim 1, wherein the signal combining circuitry comprises:
   a first voltage current converter circuitry in operable connection with the first circuitry branch and arranged to output a first current;
   a second voltage current converter circuitry in operable connection with the second circuitry branch and arranged to output a second current; and
   an adding circuitry arranged to add the first current to the second current to produce a sum current and to output the sum current.

6. The apparatus according to claim 5, wherein the first voltage current converter circuitry and the second voltage current converter circuitry are arranged to realize application of scaling factors to the first current and the second current, respectively.

7. The apparatus according to claim 1, wherein the first circuitry, the second circuitry, the signal branching circuitry, and the signal combining circuitry are arranged for use in a wireless communication system according to the Long Term Evolution and/or the Wideband Code Division Multiple Access specifications.

8. The apparatus according to claim 1, the apparatus being arranged for use in a mobile phone and comprising:
   user interface circuitry; and
   user interface software arranged to enable user control through use of a human-machine-interface.

9. The apparatus according to claim 8, wherein the human-machine-interface comprises a display.

10. The apparatus according to claim 1, the apparatus being arranged for use in a wireless communication device and comprising:
    wired interface circuitry; and
    wireless transceiver circuitry.

11. A mobile phone comprising the apparatus according to claim 1.

12. A method for use in a communication device, the method comprising:
    branching an input signal into a first signal and a second signal;
    processing the first signal in a first circuitry;
    transferred impedance filtering the second signal in a second circuitry according to a filter clock frequency; and
    combining the processed first signal and the filtered second signal such that signal components of the processed first signal and the filtered second signal are in-phase for signal frequencies equal to the filter clock frequency.

13. The method according to claim 12, comprising continuous time filtering either the input signal prior to branching the input signal or an output signal corresponding to the combination of the processed first signal and filtered second signal,
    wherein the filter clock frequency approximately matches a frequency passband edge of the continuous time filter.

14. The method according to claim 12, comprising:
    applying a first scaling factor to the processed first signal; and
    applying a second scaling factor to the filtered second signal.

15. The method according to claim 12, wherein the transferred impedance filtering of the second signal in the second circuitry according to a filter clock frequency comprises consecutively connecting a plurality of capacitors in a forward direction and consecutively connecting the plurality of capacitors in a reverse direction in accordance with the filter clock frequency.

16. The method according to claim 12, wherein combining the processed first signal and the filtered second signal comprises:
    voltage current conversion of the processed first signal and outputting a first current;
    voltage current conversion of the filtered second signal and outputting a second current; and
    adding the first current to the second current to produce a sum current and outputting the sum current.

17. The method according to claim 16, wherein the voltage current conversion of the processed first signal and the filtered second signal comprises applying scaling factors to the first current and the second current respectively.

* * * * *